(12) United States Patent
Iwasaki et al.

(10) Patent No.: US 7,998,763 B2
(45) Date of Patent: Aug. 16, 2011

(54) METHOD FOR MANUFACTURING SEMICONDUCTOR APPARATUS AND MOLD ASSEMBLY FOR THE SAME

(75) Inventors: Kazuyuki Iwasaki, Tokyo (JP); Ryuichi Goto, Tokyo (JP); Shogo Sakuma, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/619,773

(22) Filed: Nov. 17, 2009

(65) Prior Publication Data
US 2010/0124794 A1  May 20, 2010

(30) Foreign Application Priority Data

Nov. 17, 2008  (JP) .................................. 2008-293469

(51) Int. Cl.
*H01L 21/00*  (2006.01)

(52) U.S. Cl. ................ 438/25; 438/27; 438/64; 438/68; 438/127; 438/460; 257/E21.502

(58) Field of Classification Search .......... 438/106–127, 438/25, 27, 64, 68, 460–464; 257/E21.502
See application file for complete search history.

(56) References Cited

U.S. PATENT DOCUMENTS

| 7,892,869 B2 * | 2/2011 | Chuang et al. .................. 438/26 |
| 2006/0261366 A1 | 11/2006 | Yang |

FOREIGN PATENT DOCUMENTS

| JP | 2002-344030 A | 11/2002 |
| JP | 2003-31854 A | 1/2003 |
| JP | 2006-324623 A | 11/2006 |

\* cited by examiner

*Primary Examiner* — Richard A. Booth
(74) *Attorney, Agent, or Firm* — Kenealy Vaidya LLP

(57) ABSTRACT

A method for manufacturing a semiconductor apparatus which does not hamper the miniaturization of products and can simplify the manufacturing process without the optical performance deteriorating is described. Furthermore, a mold assembly for use in molding a semiconductor apparatus can be provided. A substrate can be set within a lower mold, wherein a plurality of optical semiconductor elements are mounted on the substrate at predetermined intervals. Primary transfer molding using the lower mold and a primary upper mold can be carried out to form a plurality of frame bodies so as to surround the respective optical semiconductor elements. While the substrate is set on the lower mold, secondary transfer molding using the lower mold and the secondary upper mold can be carried out to form the light-transmitting portions so as to cover the optical semiconductor elements and the frame bodies on the substrate. Then, a multi-piece product of semiconductor apparatuses can be removed from the molds and cut by a dicer to separate the individual semiconductor apparatuses.

15 Claims, 6 Drawing Sheets

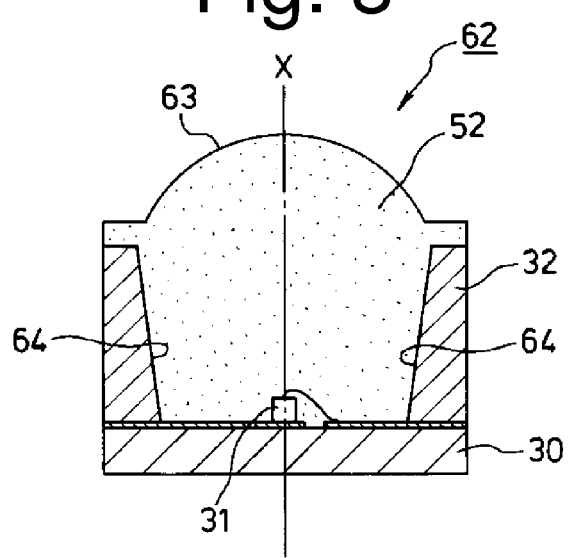
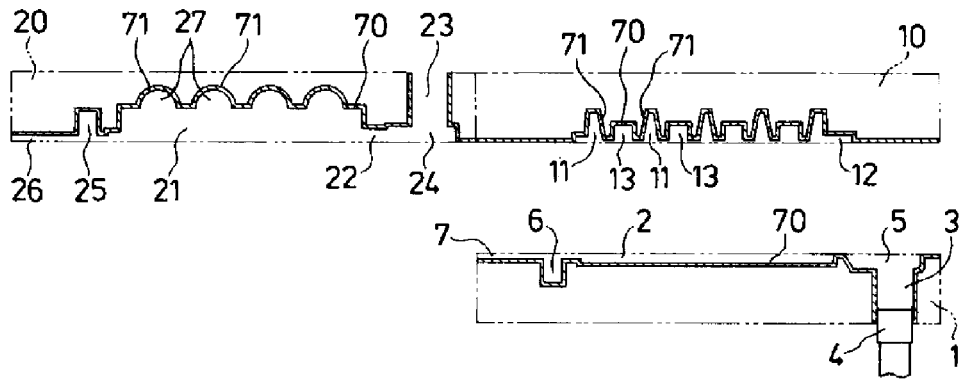

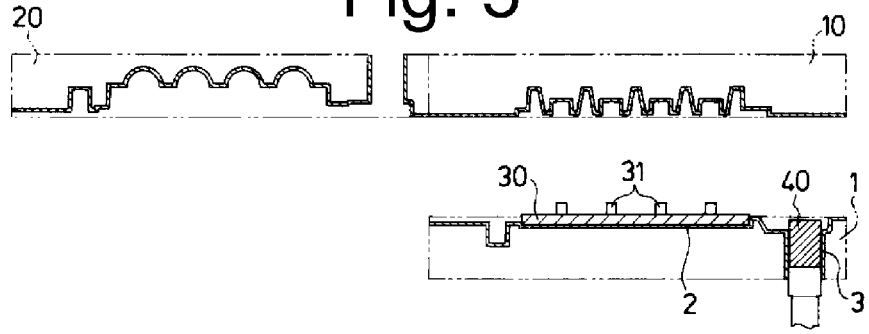
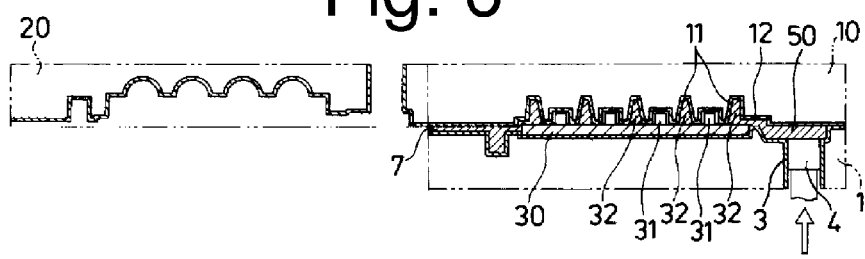
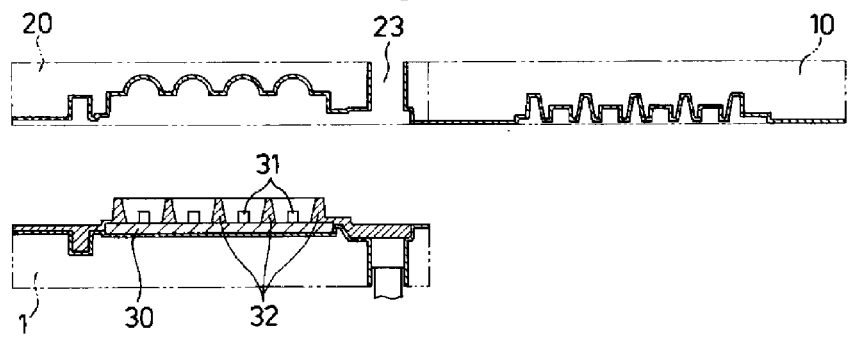

METHOD FOR MANUFACTURING SEMICONDUCTOR APPARATUS AND MOLD ASSEMBLY FOR THE SAME

This application claims the priority benefit under 35 U.S.C. §119 of Japanese Patent Application No. 2008-293469 filed on Nov. 17, 2008, which is hereby incorporated in its entirety by reference.

TECHNICAL FIELD

The presently disclosed subject matter relates to a method for manufacturing a semiconductor apparatus and a mold assembly for molding a semiconductor apparatus. In particular, the presently disclosed subject matter relates to a method for manufacturing a semiconductor apparatus by resin-sealing a semiconductor element through a transfer mold technique and a mold assembly for molding a semiconductor apparatus.

BACKGROUND ART

A known semiconductor light emitting apparatus can include a substrate, a frame body mounted on the substrate, the frame body having a light-shielding property and a reflective property, a semiconductor light emitting element mounted on the substrate that is exposed within the frame body, and a light-transmitting resin filled inside the frame body to resin-seal the semiconductor light emitting element. This type of conventional semiconductor light emitting apparatus can be manufactured by the method shown in FIGS. 1A to 1E, for example, including:

Step (a): fabricating a multi-piece substrate 101 on which a plurality of semiconductor light emitting elements 100 are mounted at predetermined intervals (FIG. 1A);

Step (b): performing primary transfer molding using a light transmitting resin to form a light transmitting portion 102 with a predetermined thickness on the mounted substrate 101 (thereby resin-sealing semiconductor light emitting elements shown in FIG. 1B);

Step (c): cutting the light transmitting portion 102 using a dicer to form grooves 13 at predetermined intervals in the longitudinal and transverse directions with a predetermined depth and a predetermined width (FIG. 1C);

Step (d): performing secondary transfer molding using a resin having a light-shielding property and a reflective property to form frame bodies 104 within the grooves (FIG. 1D);

Step (e): cutting the product along the frame bodies 104 using a dicer to separate individual substrates 101 having the respective semiconductor light emitting elements mounted thereon together with the respective frame bodies 104 (FIG. 1E).

Through the above steps (a) through (e), a plurality of semiconductor light emitting elements 105 having the appearance shown in FIG. 1F can be simultaneously completed (for example, Japanese Patent Application Laid-Open Nos. 2002-344030 and 2003-31854).

Another method has been proposed as follows (for example, see Japanese Patent Application Laid-Open No. 2006-324623). First, a frame body is formed by performing primary transfer molding. Then, the product is released from the mold, and a light emitting body is disposed within the frame body. The resulting product is again set in the mold to perform secondary transfer molding so that a space within the frame body is filled with a light-transmitting resin for resin-sealing.

SUMMARY

The production methods of a semiconductor light emitting apparatus as disclosed in Japanese Patent Application Laid-Open Nos. 2002-344030 and 2003-31854 require two separate cutting steps using a dicer, including forming the grooves in the light-transmitting portion and separating the individual apparatuses. Accordingly, as the production methods include more steps, the productivity may deteriorate.

In some cases, the light transmitting portion can have a convex lens just above the semiconductor light emitting element during primary transfer molding using a light transmitting resin. When doing so, it is difficult to match the convex lens surface of the light transmitting portion to the concave surface of the molding mold during the secondary transfer molding using a resin which has a light-shielding property and a reflective property. Accordingly, the light transmitting portion cannot be provided with a convex lens surface, but can merely have a plane surface. The method for manufacturing a semiconductor light emitting apparatus according to JP2006-324623A1 must have two types of molds, one for molding a frame body and the other for filling the inside space of the frame body with a light transmitting resin. Furthermore, like those disclosed in JP2002-344030A1 and JP2003-31854A1, the method inevitably has a number of process steps, which leads deterioration of productivity.

In this method, the light emitting element must be disposed on the substrate exposed within the frame body after the frame body is formed by the primary transfer molding. In order to do so, an area where a bonding tool (for example, a capillary) is operated for bonding wiring is required within the frame body. This hampers the miniaturization of the semiconductor light emitting apparatus.

Another method for manufacturing a semiconductor light emitting apparatus is shown in FIGS. 2A to 2D.

A light transmitting portion 102 having a groove 103 is formed onto a multi-piece substrate 101, on which a plurality of semiconductor light emitting elements 100 are mounted, through the primary transfer molding (see FIGS. 2A and 2B). Then, a frame body 104 is formed within the groove through the secondary transfer molding (FIG. 2C).

In this case, however, the mold should have a draft angle for use in the primary transfer molding. Accordingly, the completed product (see FIG. 2D) has the frame body 104 with an inner side surface 106 that has a cone shape inclined toward an inward upper side and coincides with the side shape of the light transmitting portion 102. Accordingly, when the light is emitted from the semiconductor light emitting element 100, the light is reflected by the inner side surface 106 of the frame body 104 so that the light cannot be directed upward. This reduces the light utilization efficiency.

The presently disclosed subject matter was devised in view of these and other problems and in association with the conventional art. According to an aspect of the presently disclosed subject matter, a method for manufacturing a semiconductor apparatus that facilitates miniaturization of the products and which can simplify the manufacturing steps without the optical performance deteriorating is provided. Furthermore, a mold assembly for use in molding a semiconductor apparatus is be provided.

According to another aspect of the presently disclosed subject matter, a method for manufacturing a semiconductor apparatus can include:

setting a substrate within a first mold, wherein a plurality of optical semiconductor elements are mounted on the substrate at predetermined intervals;

performing primary transfer molding using the first mold and a first-stage second mold, the first-stage second mold having a cavity for molding a plurality of frame bodies with a thermosetting resin, the thermosetting resin having a light-shielding property and a reflective property, the plurality of frame bodies made of the thermosetting resin and formed on the substrate, the frame bodies surrounding the respective optical semiconductor elements;

replacing the first-stage second mold with a second-stage second mold, the second-stage second mold having a cavity for molding light-transmitting portions while the substrate is maintained within the first mold;

performing secondary transfer molding using the first mold and the second-stage second mold with a light-transmitting thermosetting resin that is transparent to at least a part of a wavelength range of light that the optical semiconductor elements can emit or receive, to form the light-transmitting portions made of the thermosetting resin which covers the optical semiconductor elements and the frame bodies on the substrate;

releasing a multi-piece product of semiconductor apparatuses from the first mold and the second-stage second mold, each semiconductor apparatus including at least one e frame body and light-transmitting portion formed on the substrate; and cutting the multi-piece product of semiconductor apparatuses at predetermined intervals to separate each individual semiconductor apparatuses.

In the above configuration, the cavity for molding light-transmitting portions of the second-stage second mold can have a spherical or aspherical concave portion disposed above the optical semiconductor element during the secondary transfer molding using the first mold and the second-stage second mold.

In the above configuration, the first mold can have a surface where the substrate for mounting optical semiconductor elements thereon is set, the first-stage second mold can have a surface where the cavity for molding frame bodies is formed, the second-stage second mold can have a surface where the cavity for molding light-transmitting portions is formed, and these surfaces are provided with a releasing film over all.

In the above configuration, at least an inner surface of the cavity for molding frame bodies and an inner surface of the cavity for molding light-transmitting portions can be provided with a releasing film made of triazine thiol.

Furthermore, in the above configuration, the light-transmitting thermosetting resin can include at least one of a phosphor, a dye, a pigment, and a mixture thereof.

In the above configuration, the first mold and the second-stage second mold each are provided with a material supplying portion that is substantially perpendicular to the opposing surfaces of the first mold and the second-stage second mold, the material supplying portions having respective central axes that are substantially disposed along a same line.

According to still another aspect of the presently disclosed subject matter, a mold assembly for molding a semiconductor apparatus can be provided. The semiconductor apparatus can have a substrate, a frame body formed on the substrate, an optical semiconductor element disposed on the substrate and exposed within the frame body, and a light-transmitting portion resin-sealing the optical semiconductor element within the frame body and having an optically function surface. The mold assembly can include:

a first mold having a first cavity in which a substrate for mounting optical semiconductor elements is set, a first material supplying portion being in communication with the cavity for setting the substrate, and a first plunger inserted into the material supplying portion so as to be reciprocatingly movable within the first material supplying portion;

a first-stage second mold having a second cavity for molding frame bodies, a runner to face to the first material supplying portion of the first mold so as to be in communication with the second cavity for molding the frame bodies, and a concave portion for accommodating a plurality of optical semiconductor elements;

a second-stage second mold having a third cavity for molding light-transmitting portions, a second material supplying portion being in communication with the third cavity for molding the light-transmitting portions, and a second plunger inserted into the second material supplying portion, the second plunger capable of being reciprocatingly movable within the second material supplying portion, wherein the first material supplying portion of the first mold and the second material supplying portion of the second-stage second mold can be substantially perpendicular to opposing surfaces of the first mold and the second-stage second mold, and can have respective central axes that are substantially disposed along a same line.

In the above configuration, the first mold can further have a first resin reservoir portion disposed on an opposite side to the first material supplying portion with the first cavity interposed therebetween, and a first air vent disposed on an outer side of the first mold and adjacent to the first resin reservoir portion.

Furthermore, in the above configuration, the second-stage second mold can further include a second resin reservoir portion disposed on an opposite side to the second material supplying portion with the third cavity interposed therebetween, and a second air vent disposed on an outer side of the second-stage second mold and adjacent to the resin reservoir portion.

According to another aspect of the presently disclosed subject matter, a substrate on which a plurality of optical semiconductor elements have already been mounted can be set on the first mold, and the primary transfer molding is carried out using the first mold and the first-stage second mold to form frame bodies each surrounding the optical semiconductor element on the substrate. Then, while the substrate is set on the first mold, the first-stage second mold is changed to the second-stage second mold to carry out the secondary transfer molding, thereby forming the light-transmitting portions each covering the optical semiconductor element and the frame body on the substrate. After the secondary transfer molding, a multi-piece molded product (semiconductor apparatuses) is removed from the first mold and the second-stage second mold, and then, the product is cut using a dicer to separate the individual semiconductor apparatuses.

As a result, the number of the cutting processes or steps using a dicer can be minimized to one, thereby reducing the number of the required steps and improving productivity.

As the primary transfer molding can form the frame bodies, the cavity can have an appropriate draft angle. This can shape the inner side surfaces of the frame body (reflective surface) in the form of a truncated cone, thereby improving the light output efficiency and enhancing the light utilization efficiency.

Furthermore, after mounting the optical semiconductor elements on the substrate, the frame bodies and the light-transmitting portions can be molded by carrying out the primary and secondary transfer moldings. Accordingly, an operation space for a bonding tool, such as a capillary for wire bonding, can be eliminated within the frame body, which leads to miniaturization of semiconductor apparatuses.

Each of the molds can have a surface treated at particular portions with a material effective for releasing, thereby imparting high releasing properties. As the material can have durability for releasing operation, a releasing aid does not need to be applied every time the molding is carried out. This can reduce the number of the required process steps, improving economic effects.

BRIEF DESCRIPTION OF DRAWINGS

These and other characteristics, features, and advantages of the presently disclosed subject matter will become clear from the following description with reference to the accompanying drawings, wherein:

FIG. 3 is a cross-sectional view showing a semiconductor apparatus manufactured by a method in accordance with principles of the presently disclosed subject matter;

FIG. 4 is an explanatory cross-sectional view illustrating preparation of molds according to an embodiment of the manufacturing method of the presently disclosed subject matter;

FIG. 5 is an explanatory cross-sectional view illustrating clamping the molds according to an embodiment of the manufacturing method of the presently disclosed subject matter;

FIG. 6 is an explanatory cross-sectional view illustrating performing the primary transfer molding according to an embodiment of the manufacturing method of the presently disclosed subject matter;

FIG. 7 is an explanatory cross-sectional view illustrating changing the molds according to an embodiment of the manufacturing method of the presently disclosed subject matter;

DESCRIPTION OF EXEMPLARY EMBODIMENTS

Figure 1A:
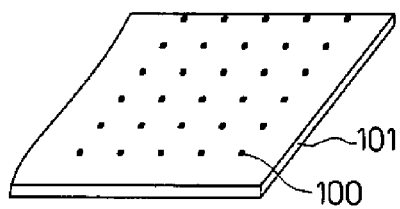
FIGS. 1A, 1B, 1C, 1D, and 1E illustrate a conventional method for manufacturing semiconductor light emitting apparatuses.
Figure 1B:
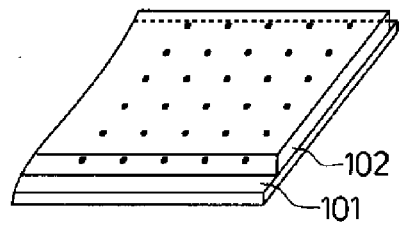
Figure 1C:
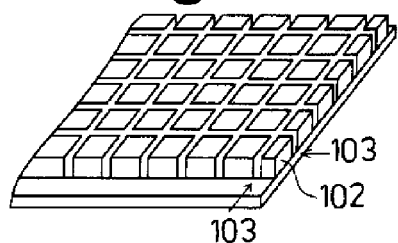
Figure 1D:
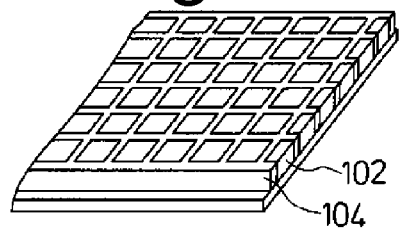
Figure 1E:
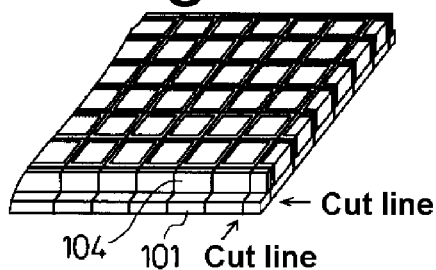
Figure 1F:
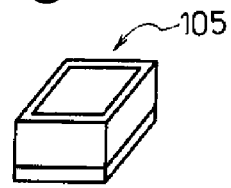
FIG. 1F is a perspective view illustrating a semiconductor light emitting apparatus manufactured by the conventional method.
Figure 2A:
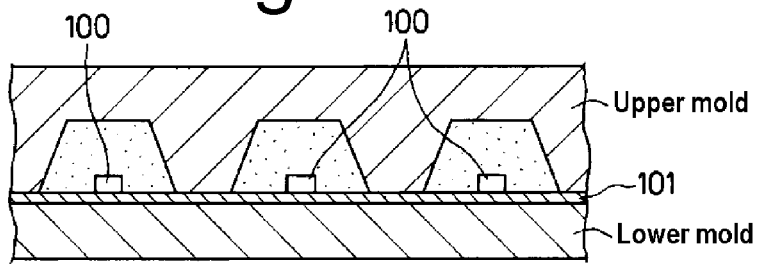
FIGS. 2A, 2B, 2C, and 2D illustrate another conventional method for manufacturing semiconductor light emitting apparatuses.
Figure 2B:
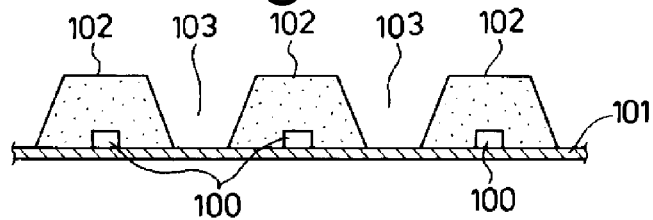
Figure 2C:
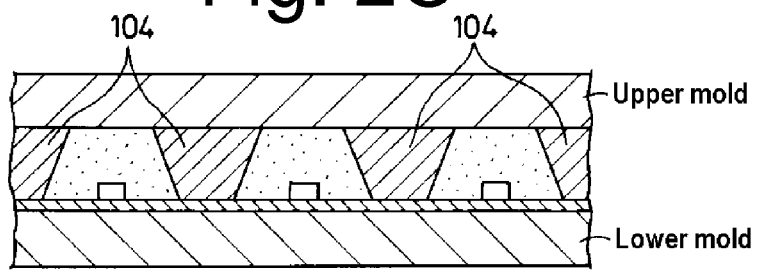
Figure 2D:
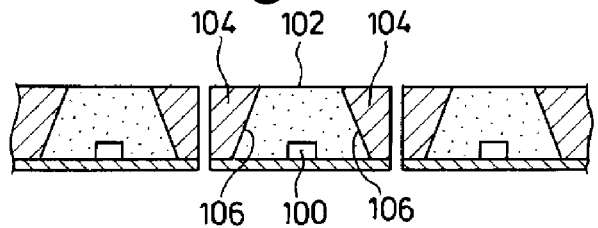

A description will now be made below to a manufacturing method of the presently disclosed subject matter with reference to the accompanying drawings (FIGS. 3 through 12) in accordance with exemplary embodiments.

FIG. 3 is a cross-sectional view illustrating a semiconductor apparatus made in accordance with an embodiment of the manufacturing method of the presently disclosed subject matter.

A semiconductor apparatus 62 can include a substrate 30, an optical semiconductor element 31 mounted on the substrate 30, a frame body 32 made of a thermosetting resin having a light-shielding property and a reflective property formed on the substrate 30 having the optical semiconductor element 31 mounted thereon, and a light-transmitting portion 52 made of a light-transmitting thermosetting resin disposed within the frame body 32 and on the upper surface of the frame body 32. It should be noted that the light-transmitting thermosetting resin is transparent to at least a part of a wavelength range of light that the optical semiconductor element 31 can emit or receive.

After the resin-sealing of the optical semiconductor element 31 is performed to cover the optical semiconductor element 31, the light-transmitting portion 52 can have a spherical or aspherical convex lens surface 63 above the optical semiconductor element 31.

When the optical semiconductor element 31 is a light emitting element such as an LED and light beams are emitted from the optical semiconductor element 31, the light beams are guided within the light-transmitting portion 52 and reach the lens surface 63 that can serve as a light emitting surface. The light beams can be refracted at the lens surface 63 in the optical axis X direction of the optical semiconductor element 31 so that the light beams can be emitted to the outside of the light-transmitting portion 52.

When the optical semiconductor element 31 is a light receiving element such as a photodiode, a phototransistor, and the like, the beams of light reaching the lens surface 63 of the light-transmitting portion 52 externally are refracted in the optical axis X direction of the optical semiconductor element 31 at the lens surface 63, so as to enter the light-transmitting portion 52. Furthermore, the light is guided within the light-transmitting portion 52 to converge on the optical semiconductor element 31.

In the present instance, the frame body 32 can function as follows: namely, when the optical semiconductor element 31 is a light emitting element, the light beams emitted from the optical semiconductor element 31 can be guided within the light-transmitting portion 52. Then, the light beams traveling toward the inner side surface 64 of the frame body 32 can be shielded by the inner side surface 64 so that the beams of light cannot be emitted outside therefrom. Then, the light beams can be reflected by the inner side surface 64 to be guided through the light-transmitting portion 52 to the lens surface 63. When reaching the lens surface 63, the light beams can be refracted in the optical axis X direction of the optical semiconductor element 31 at the lens surface 63, so as to be emitted outside.

When the optical semiconductor element 31 is a light receiving element, the light beams reaching the lens surface 63 of the light-transmitting portion 52 can enter the inside of the light-transmitting portion 52. Furthermore, the light is guided within the light-transmitting portion 52 toward the inner side surface 64 of the frame body 32. The light beams can be reflected by the inner side surface 64 to be converged on the optical semiconductor element 31.

A semiconductor apparatus having such a configuration can be manufactured by the method as shown in FIGS. 4 to 11.

The manufacturing method of the semiconductor apparatus made in accordance with the principles of the presently disclosed subject matter can employ a single lower mold (first mold) and a pair of upper molds (first-stage and second-stage second molds, or primary upper mold and secondary upper mold).

In preparing molds as shown in FIG. 4, the lower mold 1 and the primary upper mold 10 and the secondary upper mold 20 are prepared.

The lower mold 1 can be provided with a concave portion 2 for allowing a substrate 30 to be set thereon, wherein the substrate 30 has been provided with a plurality of optical semiconductor elements mounted thereon, as described later. The lower mold 1 can also be provided with a plunger pot 3 (or a material supplying portion) and a plunger 4 inserted in the plunger pot 3 so as to be reciprocatingly movable. A cull reservoir portion 5 can be provided toward the upper end opening of the plunger pot 3 of the lower mold 1. The diameter thereof can be larger than that of the plunger pot 3. The lower mold 1 can be further provided with a resin reservoir 6, disposed on an opposite side of the plunger pot 3, and an air vent 7 for communicating the resin reservoir 6 with the outside of the lower mold 1.

The primary upper mold 10 can be provided with a cavity for molding a frame body 11, a runner 12 for communicating with the cavity 11, and concave portions 13 for accommodating a plurality of optical semiconductor elements. The plurality of concave portions 13 can accommodate the optical semiconductor elements when the primary upper mold 10 is clamped with the lower mold 1 to which the substrate 30 with the optical semiconductor elements is set.

The secondary upper mold 20 can be provided with a cavity 21 for molding a light-transmitting portion, and a runner 22 for communicating with the cavity 21. The secondary upper mold 20 can be provided with a plunger pot 23 and a cull reservoir portion 24 provided at a lower end opening of the plunger pot 23. The diameter of the cull reservoir portion 24 can be larger than that of the plunger pot 23. The runner 22 can communicate with the cull reservoir portion 24. Furthermore, the secondary upper mold 20 can be provided with a resin reservoir 25 disposed on the opposite side of the plunger pot 23 with the cavity 21 interposed therebetween. The secondary upper mold 20 can also include an air vent 26 for communicating the resin reservoir 25 with the outside of the secondary upper mold 20.

Spherical or aspherical concave portions 27 can be formed in the cavity 21 for molding a light-transmitting portion. Each concave portion 27 can be disposed above each corresponding optical semiconductor element 31 when the secondary upper mold 20 is clamped with the lower mold 1 to which the substrate 30 with the optical semiconductor elements is set.

It should be noted that the lower mold 1 can have a surface where the concave portion 2 allows the substrate to be set, the primary upper mold 10 can have a surface where the cavity 11 for molding frame bodies is formed, and the secondary upper mold 20 can have a surface where the cavity 21 for molding light-transmitting portions is formed. These surfaces of the molds, including the inner peripheral surfaces of the plunger pots 3 and 23, can be provided with a releasing film.

It should be noted that at least the inner surface of the cavity 11 for molding frame bodies of the primary upper mold 10 can serve as a surface for forming an optically functioning surface such as an optical reflective surface of the frame body 32 or the like. Furthermore, at least the inner surface of the cavity 21 for molding light-transmitting portions of the secondary upper mold 20 can serve as a surface for forming an optically functioning surface such as a lens surface, a prism surface or the like. Accordingly, it is preferable to form a triazine thiol film 71 on these surfaces, as the triazine thiol film can be formed as a uniformly thin film, have a favorable durability, and providing higher releasing ability (see FIG. 4).

FIG. 5 shows a part of the clamping step according to an embodiment of the disclosed subject matter. In the clamping step, a substrate 30, on which a plurality of optical semiconductor elements 31 have been already mounted at predetermined intervals, is set within the concave portion 2 of the lower mold 1. In addition to this, a tablet 40 made of a thermosetting resin having a light-shielding property and a reflective property can be supplied to the plunger pot 3 while heated. Then, the lower mold 1 and the primary upper mold 10 can be clamped together.

FIG. 6 shows the primary transfer molding step according to an embodiment of the disclosed subject matter. In the primary transfer molding step, the heated tablet 40 (shown in FIG. 5) supplied within the plunger pot 3 can be pressurized by the plunger 4 to a molten state. This molten resin 50 can be injected into the cavity 11 for molding frame bodies through the runner 12 of the primary upper mold 10. In this instance, air present within the upper and lower molds 10 and 1 and gasses generated from the molten resin 50 can be evacuated from the air vent 7 to the outside of the upper and lower molds 10 and 1.

As a result of the primary transfer molding step, the frame bodies 32 made of the thermosetting resin having a light-shielding property and a reflective property can be formed while surrounding the respective optical semiconductor elements 31 on the substrate 30.

FIG. 7 shows the mold changing step according an embodiment of the disclosed subject matter. In the mold changing step, first the lower mold 1 and the primary upper mold 10 are opened. In this instance, the substrate 30 is still held on the lower mold 1. It should be noted that the plurality of optical semiconductor elements 31 are mounted on the substrate 30 and the frame bodies 32 surround the respective optical semiconductor elements 31.

In this state, the lower mold 1 can be rotated, slid or the like to be moved to the prepared secondary upper mold 20 so that they face to each other at a predetermined physical relationship.

At that time, a plunger is not provided in the plunger pot 23 of the secondary upper mold 20 so that the plunger pot 23 is vacant.

Figure 8:
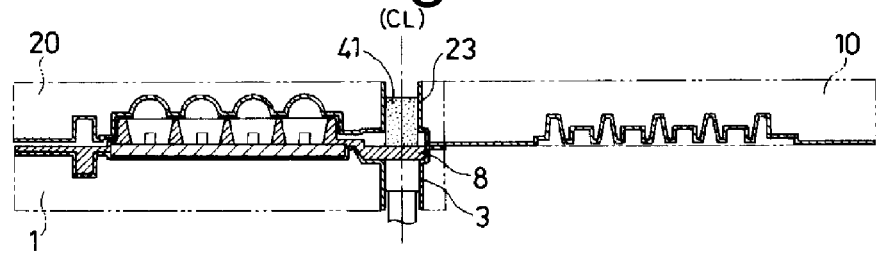
FIG. 8 is an explanatory cross-sectional view illustrating clamping the molds again according to an embodiment of the manufacturing method of the presently disclosed subject matter.

FIG. 8 shows the second clamping step according an embodiment of the disclosed subject matter. In this second clamping step, the lower mold 1 and the secondary upper mold 20 can be clamped together. Then, a tablet 41 made of a light-transmitting thermosetting resin can be supplied into the plunger pot 23 while heated. It should be noted that the tablet 41 supplied to the plunger pot 23 is disposed above the cull 8 made of the thermosetting resin formed in the primary transfer molding step and having a light-shielding property and a reflective property.

In this case, the plunger pot 3 of the lower mold 1 has a center axis (CL) and the plunger pot 23 of the secondary upper mold 20 has its center axis (CL), and they are preferably disposed such that the center axes (CL) thereof are aligned. This configuration can improve the accuracy in thickness as well as can shorten the molding time.

Figure 9:
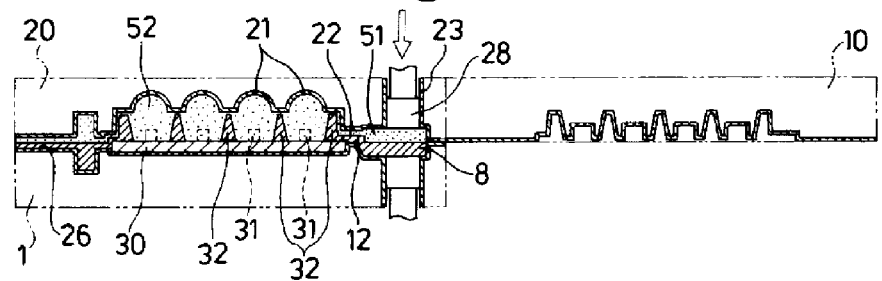
FIG. 9 is an explanatory cross-sectional view illustrating performing the secondary transfer molding according to an embodiment of the manufacturing method of the presently disclosed subject matter.

FIG. 9 shows the secondary transfer molding step according an embodiment of the disclosed subject matter. In the secondary transfer molding step, a plunger 28 is arranged within the plunger pot 23 so as to be reciprocatingly movable within the pot 23. Then, the plunger 28 can pressurize the heated tablet 41 (shown in FIG. 8) in the plunger pot 23 to melt the tablet 41. The resulting molten resin 51 can be injected into the cavity 21 for molding light-transmitting portions through the runner 22 of the secondary upper mold 20. In this instance, the molten resin 51 can be injected into the cavity 21 while flowing in contact with the upper surfaces of cull 8 and the resin within the runner 12, which were formed in the primary transfer molding step.

In this instance, air present within the upper and lower molds 20 and 1 and gasses generated from the molten resin 51 can be evacuated from the air vent 26 to the outside of the upper and lower molds 20 and 1.

In this secondary transfer molding step, the light-transmitting portions 52 made of a light-transmitting resin can be formed on the substrate 30 so as to cover the optical semiconductor elements 31 and the frame bodies 32. This means that the optical semiconductor elements 31 and the frame bodies 32 are embedded within the light transmitting portions 52.

Figure 10:
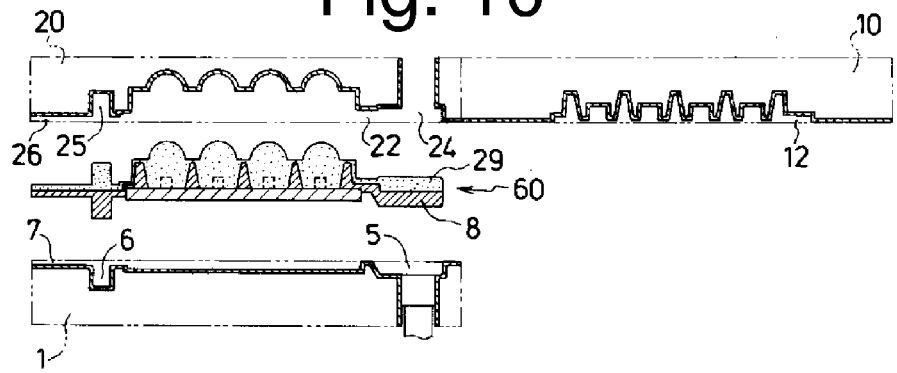
FIG. 10 is an explanatory cross-sectional view illustrating opening the molds according to an embodiment of the manufacturing method of the presently disclosed subject matter.

FIG. 10 shows the mold opening step according an embodiment of the disclosed subject matter. In this mold opening step, the lower mold 1 and the secondary upper mold 20 are opened to remove the molded article 60 from the molds 20 and 1. Together with the molded article 60, the culls 8 and 29 in the cull reservoir portions 5 and 24, and the cured resin within the molten resin passages including the runners 12 and 22, the resin reservoirs 6 and 25, and the air vents 7 and 26, are removed from the molds 20 and 1.

Figure 11:
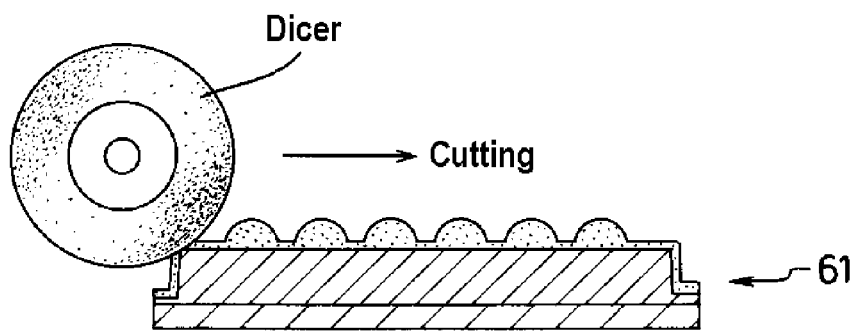
FIG. 11 is an explanatory cross-sectional view illustrating cutting the products according to an embodiment of the manufacturing method of the presently disclosed subject matter.
Figure 12:
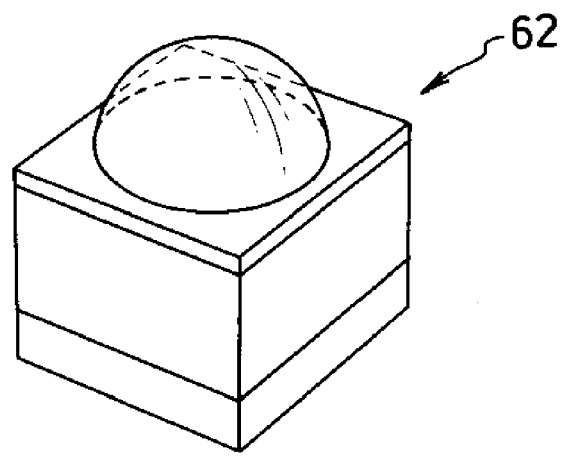
FIG. 12 is a perspective view showing the completed product manufactured by an embodiment of the manufacturing method of the presently disclosed subject matter.

FIG. 11 shows the cutting step according an embodiment of the disclosed subject matter.

In this cutting step, first culls 8 and 29 (shown in FIG. 10) and the cured resin within the molten resin passages are cut from the molded article 60 (shown in FIG. 10) for removal. Then, the multi-piece product of semiconductor apparatuses 61 is cut by a dicer to separate the individual semiconductor apparatuses (see FIGS. 3 and 12), thereby completing the semiconductor apparatuses 62.

It should be noted that, when the optical semiconductor element 31 is a light emitting element, another tablet 41, wherein a phosphor is dispersed in a light-transmitting thermosetting resin, can be used in the secondary transfer molding step. By doing so, the optical semiconductor element 31 can be resin-sealed with a light-transmitting resin in which the phosphor is dispersed. Accordingly, the resin portion 52 containing the phosphor can provide colored light different from the color of the light of the semiconductor element 31. It should be also noted that another tablet 41 can be used which can be obtained by dispersing a material in a light-transmitting thermosetting resin, wherein the material can absorb light in a particular wavelength range and be selected from a group including dyes, pigments, and/or mixtures thereof. This configuration can provide the optical semiconductor element 31 resin-sealed with a light-transmitting resin in which a light absorbing material is dispersed. In this case, when the optical semiconductor element 31 is not lit, one can observe the color by the light absorbing material in the resin. This configuration can provide a colorful semiconductor apparatus.

It should be noted that, when the optical semiconductor element 31 is a light receiving element, still another tablet 41 which can be obtained by dispersing a material that can absorb light in a particular wavelength range and be selected from a group including dyes, pigments, and/or mixtures thereof in a light-transmitting thermosetting resin, can be used in the secondary transfer molding step. This configuration can provide the optical semiconductor element 31 with a resin-sealed body with a light-transmitting resin in which a light absorbing material is dispersed. This means the optical semiconductor element 31 can receive only desired light in a particular wavelength range while removing undesired light by the filtering effect caused by the light absorbing material. This configuration can achieve a semiconductor apparatus that can be resistant to disturbance noise.

In the mold changing step, either of the upper molds and the lower molds can be stationary while the other is movable. Alternatively, both molds can be configured to move relative to one another.

In the above exemplary embodiments, the light-transmitting portion 52 is provided with the spherical or aspherical convex surface 63, but the presently disclosed subject matter is not limited to this embodiment. The shape of the cavity 21 for molding light-transmitting portions of the secondary upper mold 10 can be changed to various shapes in accordance with the intended purposes.

As described above, in the manufacturing method of a semiconductor apparatus according to the presently disclosed subject matter, a substrate on which a plurality of optical semiconductor elements have already been mounted can be set on a first mold, and a primary transfer molding is carried out using the first mold and a first-stage second mold to form frame bodies each surrounding the optical semiconductor element on the substrate. Then, while the substrate is set on the first mold, the first-stage second mold is changed to a second-stage second mold to carry out the secondary transfer molding, thereby forming the light-transmitting portions each covering the optical semiconductor element and the frame body on the substrate. After the secondary transfer molding, a multi-piece molded product (semiconductor apparatuses) is removed from the first mold and the second-stage second mold, and then, the product is cut using a dicer to separate the individual semiconductor apparatuses.

As a result, it is not necessary to remove the substrate in the mold changing step between the first-stage second mold and the second-stage second mold. This means that the number of the cutting processes using a dicer can be minimized to one, thereby reducing the required steps and improving productivity.

As the primary transfer molding can form the frame bodies, the cavity can have an appropriate draft angle. This can shape the inner side surfaces of the frame body in the form of a truncated cone that is upwardly and outwardly inclined. As a result, light emitted from the optical semiconductor element (or a light emitting element) and reflected by the inner side surface of the frame body can be directed upward effectively, thereby improving the light output efficiency and enhancing the light utilization efficiency.

Furthermore, the surfaces of the first mold and the first-stage and second-stage second molds each have a releasing film. Accordingly, a releasing aid does not need to be applied every time transfer molding is carried out, and this can eliminate a releasing aid application step. Furthermore, the inner surface of the cavity for molding frame bodies of the primary upper mold (which can serve as a surface for forming an optical reflective surface, or an inner side surface of the frame body), and the inner surface of the cavity for molding light-transmitting portions of the secondary upper mold (which can serve as a surface for forming a lens surface being a light emission surface or a light entering surface) can have a triazine thiol film. As a result, the inner side surface of the frame body and the lens surface of the light-transmitting portion that constitute the optical system can become smoothened surfaces, thereby achieving a semiconductor apparatus without hampering its optical characteristics.

Furthermore, after mounting the optical semiconductor elements on the substrate, the frame bodies and the light-transmitting portions can be molded by carrying out the primary and secondary transfer moldings. Accordingly, an operation space for a bonding tool, such as a capillary for wire bonding, can be eliminated within the frame body, which leads to miniaturization of semiconductor apparatuses.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A method for manufacturing a semiconductor apparatus comprising:

setting a substrate within a first mold, wherein a plurality of optical semiconductor elements are mounted on the substrate at predetermined intervals;

performing primary transfer molding using the first mold and a first-stage second mold, the first-stage second mold having a cavity, wherein molding includes forming a plurality of frame bodies with a thermosetting resin, the thermosetting resin having a light-shielding property and a reflective property, the plurality of frame bodies made of the thermosetting resin and formed on the substrate, the frame bodies surrounding respective optical semiconductor elements;

replacing the first-stage second mold with a second-stage second mold, the second-stage second mold having a cavity for molding light-transmitting portions while the substrate is maintained within the first mold;

performing secondary transfer molding using the first mold and the second-stage second mold with a light-transmitting thermosetting resin that is transparent to at least a part of a wavelength range of light that the optical semiconductor elements can emit or receive, to form the light-transmitting portions made of the thermosetting resin which covers the optical semiconductor elements and the frame bodies on the substrate;

releasing a multi-piece product of semiconductor apparatuses from the first mold and the second-stage second mold, each semiconductor apparatus including at least one frame body and light-transmitting portion formed on the substrate; and cutting the multi-piece product of semiconductor apparatuses at predetermined intervals to separate each individual semiconductor apparatus.

2. The method for manufacturing a semiconductor apparatus according to claim 1, wherein the cavity for molding light-transmitting portions of the second-stage second mold has at least one of a spherical concave portion and an aspherical concave portion disposed above the optical semiconductor element during the secondary transfer molding.

3. The method for manufacturing a semiconductor apparatus according to claim 1, wherein the first mold has a surface for receiving the substrate, wherein the first-stage second mold has a surface where the cavity for molding frame bodies is formed, wherein the second-stage second mold has a surface where the cavity for molding light-transmitting portions is formed, and wherein the surfaces include a releasing film.

4. The method for manufacturing a semiconductor apparatus according to claim 2, wherein the first mold has a surface for receiving the substrate, wherein the first-stage second mold has a surface where the cavity for molding frame bodies is formed, wherein the second-stage second mold has a surface where the cavity for molding light-transmitting portions is formed, and wherein the surfaces include a releasing film.

5. The method for manufacturing a semiconductor apparatus according to claim 3, wherein at least an inner surface of the cavity for molding frame bodies and an inner surface of the cavity for molding light-transmitting portions include a releasing film made of triazine thiol.

6. The method for manufacturing a semiconductor apparatus according to claim 4, wherein at least an inner surface of the cavity for molding frame bodies and an inner surface of the cavity for molding light-transmitting portions include a releasing film made of triazine thiol.

7. The method for manufacturing a semiconductor apparatus according to claim 1, wherein the light-transmitting thermosetting resin includes at least one of a phosphor, a dye, a pigment, and a mixture thereof.

8. The method for manufacturing a semiconductor apparatus according to claim 2, wherein the light-transmitting thermosetting resin includes at least one of a phosphor, a dye, a pigment, and a mixture thereof.

9. The method for manufacturing a semiconductor apparatus according to claim 3, wherein the light-transmitting thermosetting resin includes at least one of a phosphor, a dye, a pigment, and a mixture thereof.

10. The method for manufacturing a semiconductor apparatus according to claim 5, wherein the light-transmitting thermosetting resin includes at least one of a phosphor, a dye, a pigment, and a mixture thereof.

11. The method for manufacturing a semiconductor apparatus according to claim 1, wherein the first mold is generally opposed to the second-stage second mold, and the first mold and the second-stage second mold each are provided with a material supplying portion that has a central axis substantially perpendicular to opposing surfaces of the first mold and the second-stage second mold, the central axis of each of the material supplying portions being disposed substantially along a same line.

12. The method for manufacturing a semiconductor apparatus according to claim 2, wherein the first mold is generally opposed to the second-stage second mold, and the first mold and the second-stage second mold each are provided with a material supplying portion that has a central axis substantially perpendicular to opposing surfaces of the first mold and the second-stage second mold, the central axis of each of the material supplying portions being disposed substantially along a same line.

13. The method for manufacturing a semiconductor apparatus according to claim 3, wherein the first mold is generally opposed to the second-stage second mold, and the first mold and the second-stage second mold each are provided with a material supplying portion that has a central axis substantially perpendicular to opposing surfaces of the first mold and the second-stage second mold, the central axis of each of the material supplying portions being disposed substantially along a same line.

14. The method for manufacturing a semiconductor apparatus according to claim 5, wherein the first mold is generally opposed to the second-stage second mold, and the first mold and the second-stage second mold each are provided with a material supplying portion that has a central axis substantially perpendicular to opposing surfaces of the first mold and the second-stage second mold, the central axis of each of the material supplying portions being disposed substantially along a same line.

15. The method for manufacturing a semiconductor apparatus according to claim 7, wherein the first mold is generally opposed to the second-stage second mold, and the first mold and the second-stage second mold each are provided with a material supplying portion that has a central axis substantially perpendicular to opposing surfaces of the first mold and the second-stage second mold, the central axis of each of the material supplying portions being disposed substantially along a same line.

* * * * *